United States Patent
Kim et al.

(10) Patent No.: US 10,424,497 B2
(45) Date of Patent: Sep. 24, 2019

(54) WAFER CARRIER

(71) Applicant: Samsung Electronics Co., Ltd., Suwon-si, Gyeonggi-do (KR)

(72) Inventors: Bum-Soo Kim, Hwaseong-si (KR); Philwoong Jung, Hwaseong-si (KR); Yoonmi Lee, Seoul (KR); Hangryong Lim, Yeongju-si (KR); Manyoung Shin, Seongnam-si (KR); Young Hoon Son, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 15/628,725

(22) Filed: Jun. 21, 2017

(65) Prior Publication Data

US 2018/0190522 A1 Jul. 5, 2018

(30) Foreign Application Priority Data

Dec. 29, 2016 (KR) .................. 10-2016-0182663

(51) Int. Cl.
*H01L 21/67* (2006.01)
*H01L 21/673* (2006.01)
*H01L 21/00* (2006.01)

(52) U.S. Cl.
CPC .... *H01L 21/67242* (2013.01); *H01L 21/6735* (2013.01); *H01L 21/67253* (2013.01); *H01L 21/67288* (2013.01); *H01L 21/67303* (2013.01); *H01L 21/67389* (2013.01); *H01L 21/00* (2013.01)

(58) Field of Classification Search
USPC .......................................................... 702/56
See application file for complete search history.

(56) References Cited

U.S. PATENT DOCUMENTS 5,565,034 A * 10/1996 Nanbu .............. H01L 21/67173
118/319
6,467,626 B1 * 10/2002 Misaka ............ H01L 21/67017
206/213.1

(Continued)

FOREIGN PATENT DOCUMENTS

KR    10-2011-0103830 A    9/2011
KR       10-1125913 B1    3/2012

OTHER PUBLICATIONS

Johnston, M., Kymissis, I., and Shepard, K. FBAR-CMOS Oscillator Array for Mass-Sensing Applications. IEEE Sensors Journal vol. 10, No. 6 [online], Jun. 2010 [retrieved Oct. 28, 2018]. Retrieved from the Internet: <URL: https://ieeexplore.ieee.org/document/5443687>. (Year: 2010).*

*Primary Examiner* — Paul D Lee
(74) *Attorney, Agent, or Firm* — Harness, Dickey & Pierce, P.L.C.

(57) ABSTRACT

A wafer carrier including a case having an opening at one end, slots disposed in the case and receiving wafers, and a wireless communication circuitry disposed on an inner sidewall of the case and configured to detect humidity of a gas contained in the case may be provided. The wireless communication circuitry may be further configured to compare the detected humidity with a threshold humidity predetermined, and transmit a first warning signal to an external host via wireless communication when the detected humidity is greater than the threshold humidity.

20 Claims, 5 Drawing Sheets

(56) References Cited

U.S. PATENT DOCUMENTS

| | | | |
|---|---|---|---|
| 6,591,162 B1* | 7/2003 | Martin | H01L 21/67242 |
| | | | 700/225 |
| 7,790,479 B2 | 9/2010 | Favre et al. | |
| 2002/0124906 A1* | 9/2002 | Suzuki | H01L 21/67017 |
| | | | 141/98 |
| 2005/0096776 A1* | 5/2005 | Beaulieu | H01L 21/67248 |
| | | | 700/116 |
| 2006/0291988 A1* | 12/2006 | Machiyama | H01L 21/67276 |
| | | | 414/792.7 |
| 2008/0228430 A1* | 9/2008 | Bonciolini | G01P 15/18 |
| | | | 702/141 |
| 2014/0200702 A1* | 7/2014 | Liu | G01N 29/14 |
| | | | 700/112 |
| 2014/0244021 A1* | 8/2014 | Wang | H01L 21/67253 |
| | | | 700/113 |
| 2016/0370797 A1* | 12/2016 | Azarya | H01L 21/67253 |
| 2018/0061959 A1* | 3/2018 | Liu | C23C 16/44 |

\* cited by examiner

WAFER CARRIER

CROSS-REFERENCE TO RELATED APPLICATIONS

This U.S. nonprovisional patent application claims priority under 35 U.S.C § 119 to Korean Patent Application No. 10-2016-0182663 filed on Dec. 29, 2016, the entire contents of which are hereby incorporated by reference.

BACKGROUND

The present inventive concepts relate to wafer carriers, and more particularly, to a wafer carriers for storing and transferring a wafer.

With the advancement of high integration of semiconductor devices, fabrication processes are becoming more and more complicated. In addition, an increased time may be spent to transfer and stand by wafers between fabrication facilities. For example, the wafers may be introduced into and then transferred between the fabrication facilities. The wafers in a carrier may be contaminated from various contamination sources.

SUMMARY

Some example embodiments of the present inventive concepts provide wafer carriers capable of determining whether a nitrogen gas is leaked.

Some example embodiments of the present inventive concepts provide wafer carriers capable of determining whether the carrier is contaminated with particles.

According to some example embodiments of the present inventive concepts, a wafer carrier may include a case including an opening at one end, slots disposed in the case and configured to receive wafers, and a wireless communication circuitry disposed on an inner sidewall of the case and configured to detect humidity of a gas contained in the case. The wireless communication circuitry may be configured to compare the detected humidity with a threshold humidity and transmit a first warning signal to an external host via wireless communication when the detected humidity is greater than the threshold humidity.

According to some example embodiments of the present inventive concepts, a wafer carrier may include a case, sensors disposed in the case, and a wireless communication circuitry connected to the sensors and configured to transmit sense signals of the sensors to an external host via wireless communication.

According to some example embodiments of the present inventive concepts, a method of fabricating a semiconductor device may include loading a plurality of wafers in a carrier, detecting humidity or vibrations in the carrier, and determining whether the carrier is contaminated due to the detected humidity or vibrations.

According to some example embodiments of the present inventive concepts, a wafer carrier may include a case defining a space therein and having an opening at least one side thereof, a slot wall on an inner sidewall of the case, the slot wall including slots configured to receive wafers, a door configured to open and close the case, and wireless communication circuitry between the slot wall and the inner sidewall of the case and at a location adjacent to the opening, the wireless communication circuitry configured to detect at least one of (1) a humidity of a gas in the case or (2) vibration of the case or the wafers, the wireless communication circuitry further configured to compare results of the detection with at least one threshold value and transmit at least one warning signal to an external host via wireless communication when the results of the detection is greater than the at least one threshold value.

DETAILED DESCRIPTION

Figure 1:
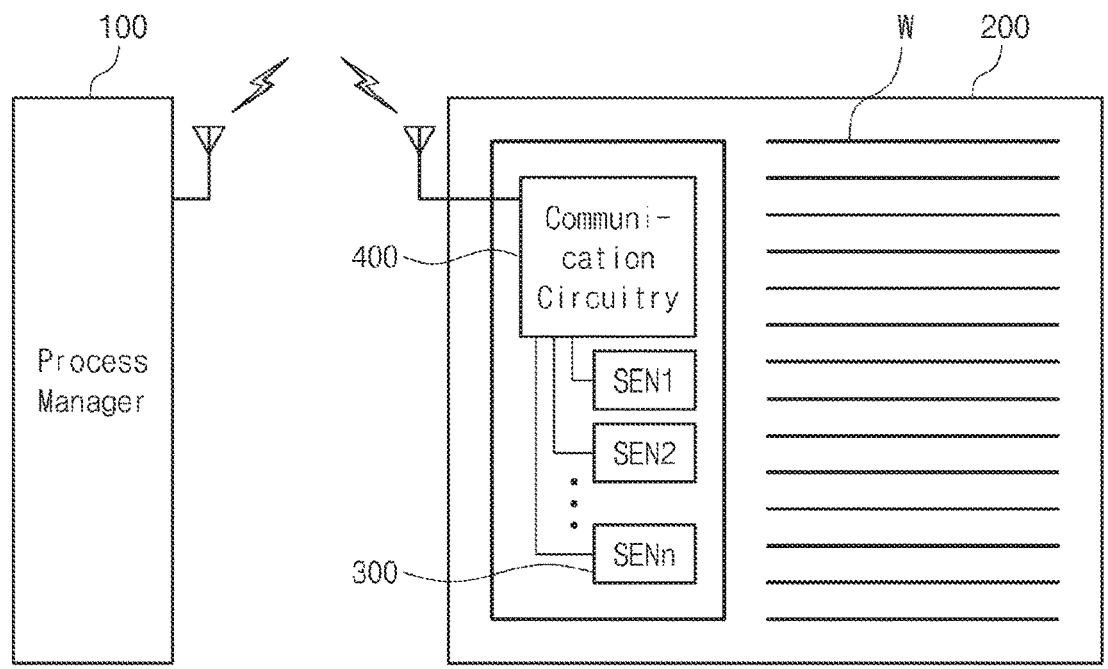
FIG. 1 shows a fabrication management system for a semiconductor device according to an example embodiment of the present inventive concepts.

FIG. 1 shows a fabrication management system 10 for a semiconductor device according to an example embodiment of the present inventive concepts.

Referring to FIG. 1, the fabrication management system 10 for a semiconductor device may include a process manager 100, a carrier 200, sensors 300, and communication circuitry 400.

The process manager 100 may be configured to monitor a fabrication process for wafers W. For example, the process manager 100 may be provided as an external host including a host computer or a host server.

The carrier 200 may accommodate therein a plurality of semiconductor wafers W. For example, the carrier 200 may include a Front Open Unloading Port (FOUP). In some example embodiments, the carrier 200 may accommodate therein a glass wafer for a display device. The carrier 200 may be a cassette carrier.

The sensors 300 may be loaded in the carrier 200. The sensors 300 may sense humidity, temperature, and/or vibration of the carrier 200. In an example embodiment, the sensors 300 may include first to nth sensors SEN1, SEN2, . . . , SENn. For example, the sensors 300 may include a humidity sensor, a vibration sensor, and/or a temperature sensor. The sensors 300 may sense a gas mass in the carrier 200. For example, the sensors 300 may be Film Bulk Acoustic Resonator (FBAR) sensors including Complementary Metal Oxide Semiconductor (CMOS). In some example embodiments, the sensors 300 may sense whether the carrier 200 is in an open or closed state. The sensors 300 may sense a particle in the carrier 200. For example, the sensors 300 may include a photo sensor and/or a particle sensor.

The communication circuitry 400 may provide the process manager 100 with sense signals of the sensors 300 via wireless communication. The communication circuitry 400 may control the sensors 300 in response to a control signal of the process manager 100. For example, the process manager 100 may monitor an inner environment of the carrier 200 on the basis of the sense signals of the sensors 300.

Figure 2:
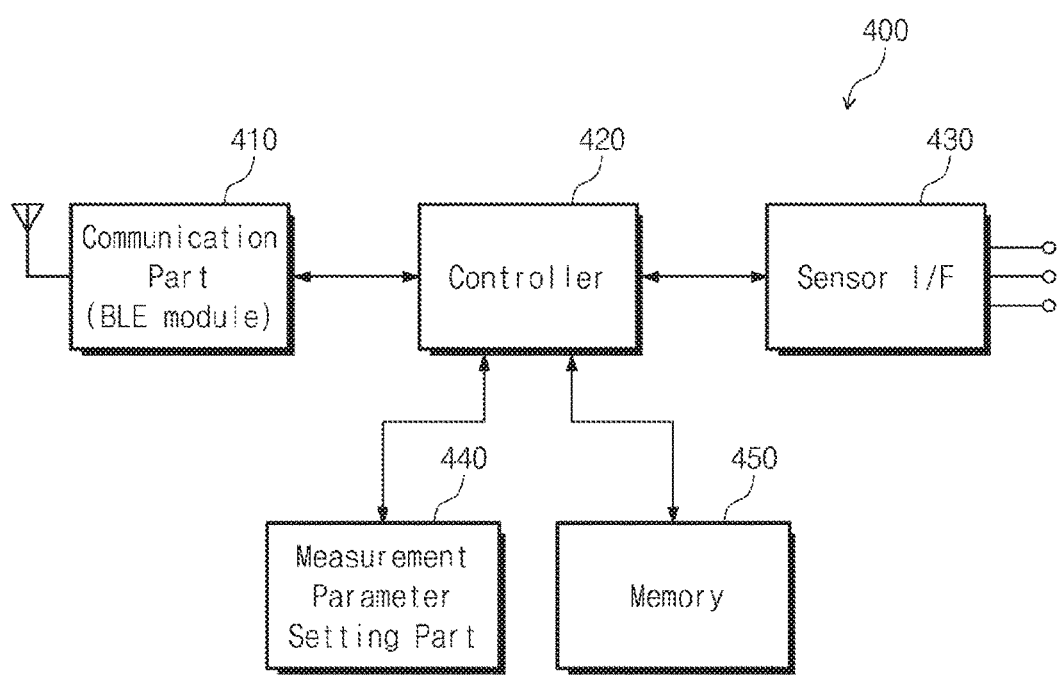
FIG. 2 is a block diagram illustrating an example of a communication circuitry shown in FIG. 1.

FIG. 2 shows an example of the communication circuitry 400 shown in FIG. 1.

Referring to FIGS. 1 and 2, the communication circuitry 400 may include a communication part 410, a controller 420, a sensor interface 430, a measurement parameter setting part 440, and a memory 450.

The communication part 410 may wirelessly communicate with the process manager 100. The communication part 410 may be connected to the controller 420. In an example embodiment, the communication part 410 may include Bluetooth Low Energy (BLE) ( ) module for short-ranged communication. The communication part 410 may receive a sensing request signal from the process manager 100. Further, the communication part 410 may receive parameter data from the process manager 100. In an example embodiment, the communication part 410 may include a beacon module. The communication part 410 may periodically receive the sense signals of the sensors 300 without receiving the sensing request signals from the process manager 100.

The controller 420 may control the communication part 410, the sensor interface 430, the measurement parameter setting part 440, and the memory 450. For example, based on the sense signals of the sensors 300, the controller 420 may determine whether the wafers W are contaminated. In some example embodiments, the controller 420 may output the sense signals of the sensors 300 to the communication part 410 in response to the sensing request signal of the process manager 100.

The sensor interface 430 may connect the controller 420 to the sensors 300. For example, the sensor interface 430 may include a differential amplifier circuit. The sensor interface 430 may amplify the sense signals of the sensors 300. The sensor interface 430 may include a noise filter. In some example embodiments, the sensor interface 430 may sense humidity, temperature, and/or vibration of the carrier 200.

Although not shown in figures, the communication circuitry 400 may include therein the sensors 300. It will be discussed hereinafter that the sensors 300 are provided separately from the communication circuitry 400. The present inventive concepts, however, are not limited thereto.

The measurement parameter setting part 440 may set the sense signals of the sensors 300 in accordance with parameter data. For example, the parameter data may be an analysis signal of a unit signal and/or a leveling signal of the sense signals from the sensors 300. In some example embodiments, the parameter data may be sensing request signals for the sense signals.

The memory 450 may store the parameter data. The memory 450 may store the sense signals. The memory 450 may store information about the control signal.

Figure 3:
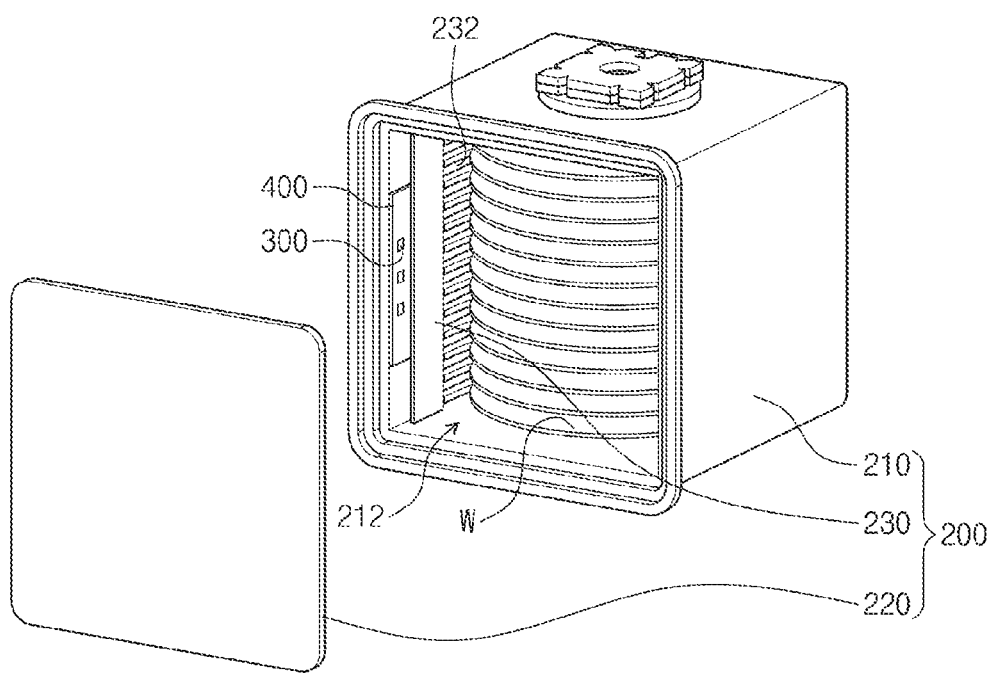
FIG. 3 is a perspective view illustrating the wafer carrier including therein a communication circuitry and sensors shown in FIG. 1.

FIG. 3 shows the sensors 300 and the communication circuitry 400 that are provided in the carrier 200 shown in FIG. 1.

Referring to FIG. 3, the carrier 200 may include a case 210, a door 220, and a slot wall 230.

The case 210 may include the slot wall 230. The case 210 may have an opening 212. The opening 212 may one-directionally expose an internal space of the case 210. The case 210 may be designed waterproof or dustproof compliant with the international protection marking (e.g., IP67 standard). The case 210 may have a material and/or structure optimized for extreme cleanness. The case 210 may include, for example, plastic and/or polycarbonate.

The opening 212 may have a tetragonal shape. The case 210 may receive the wafers W introduced through the opening 212. A robot blade (not shown) may be used to provide the wafers W into the case 210.

The door 220 may open or close the opening 212 of the case 210. The door 220 may hermetically seal the case 210. The door 220 may have a shape corresponding to the opening 212. For example, the door 220 may have a tetragonal shape.

The slot wall 230 may be disposed on oppositely facing sidewalls inside the case 210. For example, the slot wall 230 may include metal or ceramic. The slot wall 230 may have slots 232. The slots 232 may hold the wafers W. The wafers W may be inserted into the slots 232. Although not shown in figures, the inserted wafers W may be arranged at a regular interval. The inserted wafers W may be horizontally disposed.

In an example embodiment, the sensors 300 and the communication circuitry 400 may be disposed between the slot wall 230 and an inner sidewall of the case 210. The sensors 300 and the communication circuitry 400 may be seen through the opening 212. The sensors 300 and the communication circuitry 400 may be arranged to minimize or reduce interference and/or impaction by the wafers W when the wafer W is loaded into and/or unloaded through the opening 212 of the carrier 200.

Figure 4:
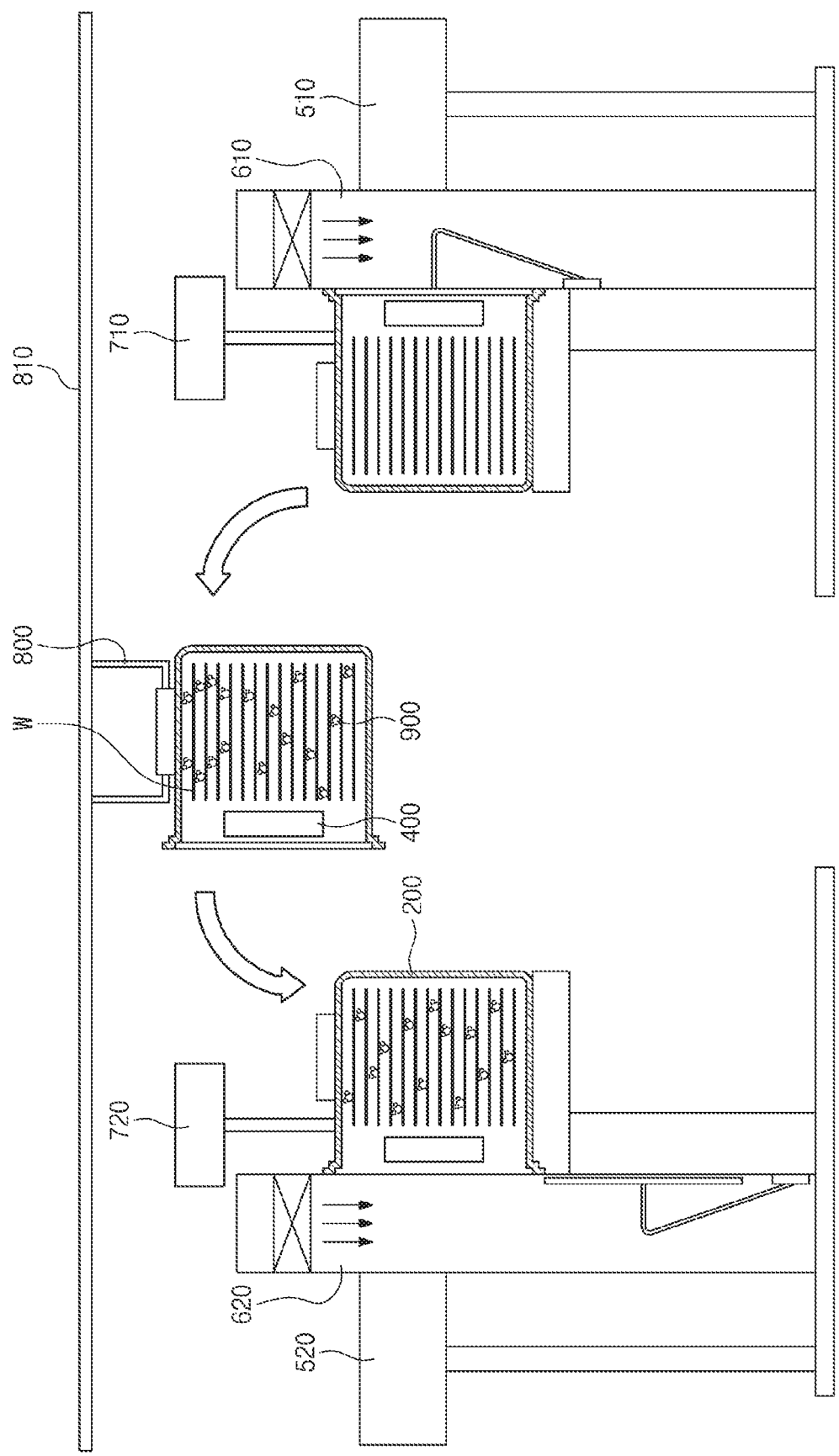
FIG. 4 shows a transfer apparatus that transfers the wafer carrier shown in FIG. 1.

FIG. 4 shows a transfer apparatus 800 that is configured to transfer the carrier 200 of FIG. 1.

Referring to FIG. 4, the transfer apparatus 800 may transfer the carrier 200 from a first chamber 510 to a second chamber 520. The transfer apparatus 800 may also transfer the carrier 200 from the second chamber 520 to the first chamber 510. In some example embodiments, the carrier 200 may be transferred between FABs and plants. When the carrier 200 is transferred, the sensors 300 may detect contamination, for example, wafer corrosion due to dew condensation.

The wafers W may experience fabrication processes performed in the first and second chambers 510 and 520. For example, the first chamber 510 may include a wet cleaning facility. The first chamber 510 may include a chemical mechanical polishing apparatus. The second chamber 520 may include a thin-film deposition facility. The second chamber 520 may include a metal deposition apparatus. In some example embodiments, the first and second chambers 510 and 520 may include a diffusion facility, an etching facility, an exposure facility, an ion implantation facility, or a stocker. In the case of the diffusion facility, the wafers W in the carrier 200 may release a diffusion gas. The diffusion gas may re-contaminate the wafers W. For example, the sensors 300 may detect a temperature change of the carrier 200 unloaded from the diffusion facility. The sensors 300 may also detect diffusion gases contained in the carrier 200. The transfer apparatus 800 may transfer the carrier 200 to a position where no interference occurs when the wafer W is loaded and/or unloaded.

The first and second chambers 510 and 520 may be engaged with first and second Equipment Front End Modules (EFEMs) 610 and 620, respectively. The first EFEM 610 may be a first buffer apparatus that connects the carrier 200 to the first chamber 510. The second EFEM 620 may be a second buffer apparatus that connects the carrier 200 to the second chamber 520. Each of the first and second EFEMs 610 and 620 may open/close the door 220 of the carrier 200.

First and second nitrogen gas injectors 710 and 720 may be disposed adjacent to the first and second chambers 510 and 520, respectively. In an example embodiment, when the door 220 closes the carrier 200, each of the first and second nitrogen gas injectors 710 and 720 may inject a nitrogen gas (N2) into the carrier 200. In some example embodiments, the nitrogen gas (N2) may be injected through purge gas supplies of the first and second chambers 510 and 520. The first sensor SEN1 of FIG. 1 may detect humidity of the carrier 200.

Figure 5:
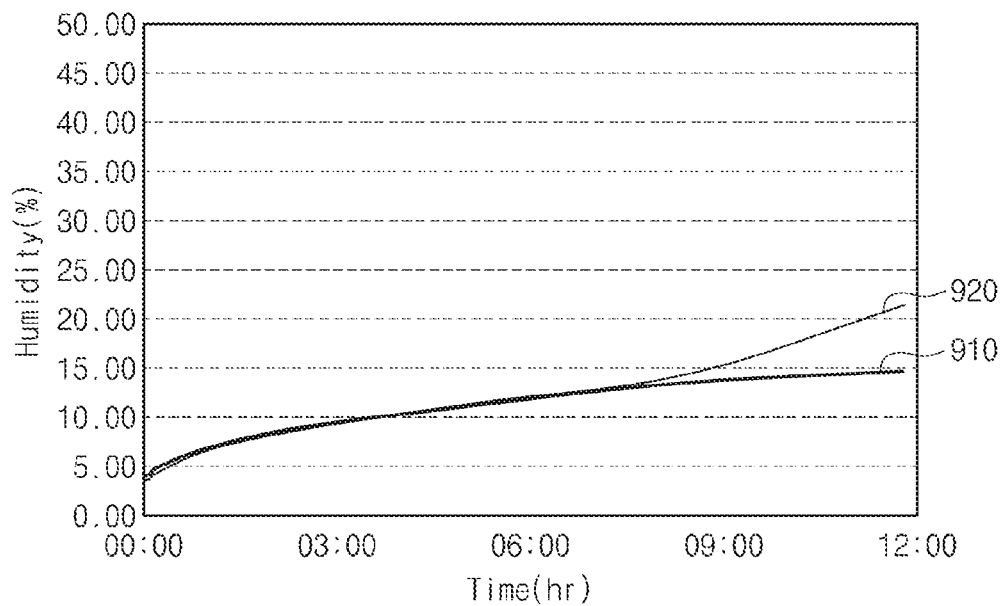
FIG. 5 is a graph illustrating a humidity change in the wafer carrier shown in FIG. 4.

FIG. 5 is a graph illustrating a humidity change in the carrier 200 shown in FIG. 4. Referring to FIG. 5, when the carrier 200 is provided with the nitrogen gas (N2), humidity in the carrier 200 may be reduced below an atmospheric humidity. For example, a normal humidity in the carrier 200 may be in the range from about 5% to about 15%. The nitrogen gas (N2) may exhibit humidity of about 5%. In some example embodiments, the nitrogen gas (N2) may exhibit humidity of less than about 5%. In the case the first chamber 510 is a wet cleaning facility, humidity in the carrier 200 may increase to about 15% due to residual moisture or water on the wafer W that has been cleaned and dried. A normal humidity 910 may be saturated to about 15%. A threshold humidity may be about 15%. In an example embodiment, the controller 420 may determine whether the nitrogen gas (N2) is leaked by comparing a detected humidity with the threshold (or reference) humidity.

First, when the carrier 200 of FIG. 3 exhibits the normal humidity 910 of less than about 15%, the controller 420 may decide that no nitrogen gas (N2) is leaked in the carrier 200. In some example embodiments, the controller 420 may transmit information about humidity of the carrier 200 through the communication part 410 to the process manager 100 of FIG. 1. The process manager 100 may then decide that the carrier 200 is in a normal state without leakage of the nitrogen gas (N2).

In contrast, when the carrier 200 exhibits an abnormal humidity 920 of more than about 15%, the controller 420 may decide that the nitrogen gas (N2) is leaked. For example, the controller 420 may transmit a first warning signal (not shown) through the communication part 410 to the process manager 100. The abnormal humidity 920 may gradually increase to atmospheric humidity of about 40%. When the nitrogen gas (N2) is leaked out of the carrier 200, the wafers W may be exposed to the atmospheric humidity. When the wafers W are exposed to the atmospheric humidity, the wafers W may suffer from contamination with particles and/or native oxide. When the controller 420 transmits information about humidity of more than about 15% through the communication part 410 to the process manager 100 of FIG. 1, the process manager 100 may decide the carrier 200 that the wafers W are contaminated due to leakage of the nitrogen gas (N2).

Referring back to FIGS. 3 and 4, when the transfer apparatus 800 transfers the carrier 200, the wafers W may be contaminated due to particles 900 contained in the carrier 200. For example, the particles 900 may be created by vibration of the carrier 200. The particles 900 may also be created by collision between the slots 232 and the wafers W in the carrier 200. The particles 900 may also be created by breakage of the wafers W. When vibration is detected by the sensors 300 of FIG. 1, the controller 420 and/or the process manager 100 may determine contamination originating from the particles 900 by comparing a detected vibration with a threshold or reference vibration.

Figure 6:
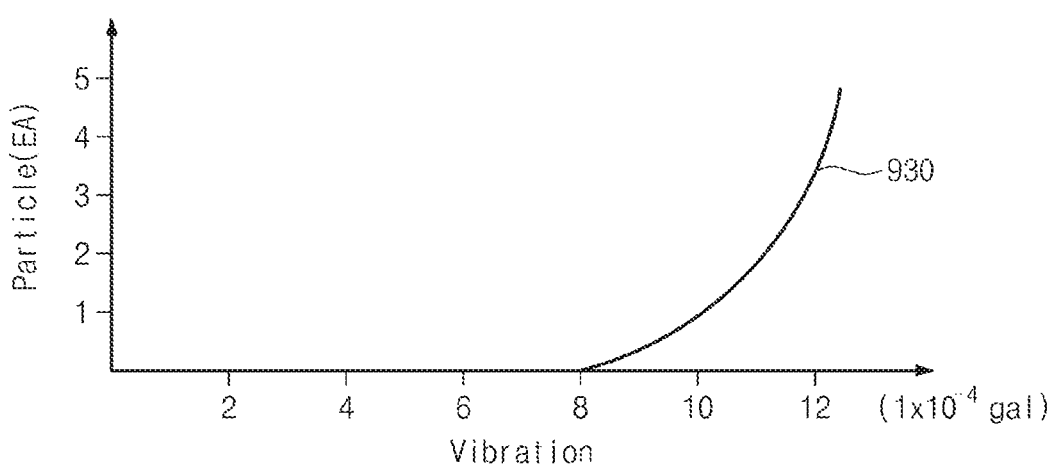
FIG. 6 is a graph illustrating occurrence of particles according to a vibration magnitude of the wafer carrier shown in FIG. 4.

FIG. 6 shows occurrence of the particles 900 according to a vibration magnitude of the carrier 200 shown in FIG. 4.

Referring to FIGS. 4 and 6, an occurrence amount 930 of the particles 900 may be proportional to vibration of the carrier 200. For example, a threshold vibration may be in the range of $8 \times 10^{-4}$ gal (e.g., 0.8 G). When the carrier 200 is vibrated at less than about $8 \times 10^{-4}$ gal (e.g., 0.8 G), the occurrence amount 930 of the particles 900 may be almost zero. When the carrier 200 is vibrated at more than about $8 \times 10{-4}$ gal (e.g., 0.8 G), the particles 900 may be created. The occurrence amount 930 may increase with vibration. The controller 420 may decide that the wafers W are contaminated due to the particles 900 originating from vibration of the carrier 200. The controller 420 may transmit a second warning signal (not shown) through the communication part 410 to the process manager 100. In some example embodiments, when the controller 420 transmits a detected vibration signal through the communication part 410 to the process manager 100, the process manager 100 may decide that the wafers W are contaminated by the particles 900 due to vibration of the carrier 200.

A method of fabricating a semiconductor device using the aforementioned fabrication management system for a semiconductor device will be discussed below.

Figure 7:
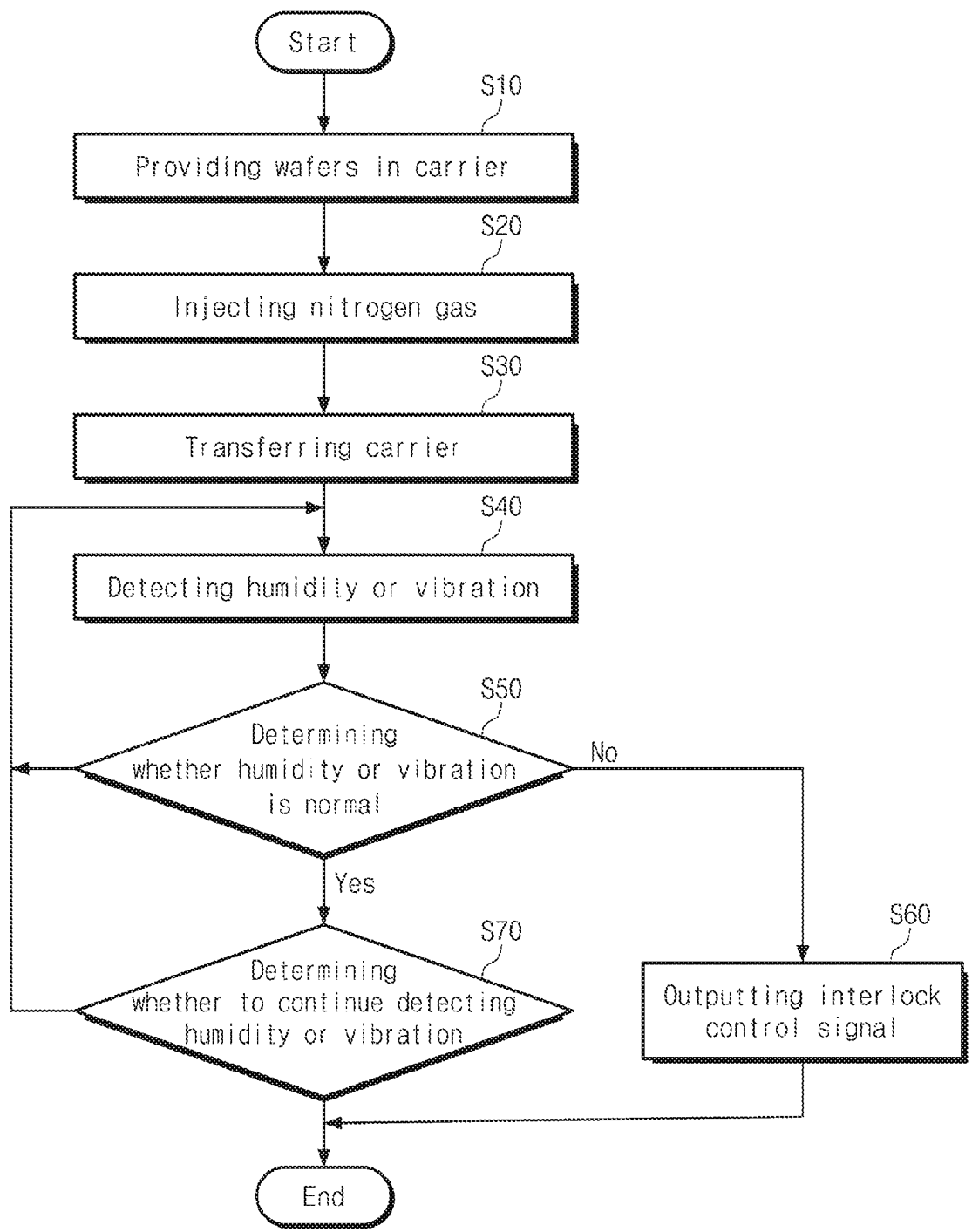
FIG. 7 is a flow chart illustrating a method of fabricating a semiconductor device using a fabrication management system shown in FIG. 1 or FIG. 4.

FIG. 7 is a flow chart illustrating a method of fabricating a semiconductor device using the fabrication management system shown in FIG. 1 or FIG. 4.

Referring to FIGS. 1, 3, and 7, a robot blade (not shown) may provide the carrier 200 with the wafers W (S10). When all the wafers W as desired are provided in the carrier 200, the opening 212 of the carrier 200 may be closed by the door 220.

Referring to FIGS. 4 and 7, the first and second nitrogen gas injectors 710 and 720 may inject a nitrogen gas (N2) into the carrier 200 (S20). For example, the nitrogen gas (N2) may exhibit humidity of about 5%. Humidity in the carrier 200 may be in the range from about 5% to about 15%.

Subsequently, the transfer apparatus 800 may transfer the carrier 200 (S30). The carrier 200 may be transferred between the first and second chambers 510 and 520. In some example embodiments, the carrier 200 may be stored in a stocker.

Referring to FIGS. 1 and 7, the sensors 300 may detect humidity and/or vibration in the carrier 200 while being transferred (S40). In some example embodiments, the sensors 300 may also sense humidity and/or vibration in the carrier 200 when the carrier 200 is in a standby state or a store state.

Thereafter, the controller 420 and/or the process manager 100 may determine contamination due to humidity and/or vibration (S50). The controller 420 and/or the process manager 100 may determine particle contamination and/or nitrogen gas (N2) leakage induced by humidity and/or vibration. For example, when humidity is higher than about 15%, the process manager 100 may decide that the nitrogen gas (N2) is leaked and/or the wafers W are contaminated. When vibration is above $8 \times 10^{-4}$ gal (e.g., 0.8 G), the process manager 100 may decide that the wafers W are contaminated with particles. The step S50 for determining the contamination may be, for example, periodically performed at a desired (or alternatively, preset) time interval.

After that, when it is determined that the wafers W are contaminated, the process manager 100 may output an interlock control signal (S60). The carrier 200 may be interrupted from being transferred between the first and second chambers 510 and 520. Thereafter, for example, a cleaning process may be performed on the carrier 200 and/or the wafers W.

As a last step, the controller 420 and/or the process manager 100 may determine whether to stop or continue detecting humidity or vibration (S70). For example, when the door 220 is open, humidity or vibration may be stopped from being detected.

According to some example embodiments of the present inventive concepts, the carrier may include therein the communication circuitry that detects humidity and/or vibration in the carrier and then transmits information about the detected humidity and/or vibration to the host (e.g., the process manager). Further, the communication circuitry may determine nitrogen gas leakage in the carrier and particle contamination on the wafers and then may transmit determined signals to the host.

Although the present inventive concepts has been described in connection with some example embodiments illustrated in the accompanying drawings, it will be understood to those skilled in the art that various changes and modifications may be made without departing from the technical spirit and essential feature of the present inventive concepts. It therefore will be understood that the example embodiments described above are just illustrative but not limitative in all aspects.

What is claimed is:

1. A wafer carrier comprising:
   a case including an opening at one end and slots configured to receive wafers; and
   a wireless communication circuitry on an inner sidewall of the case and configured to detect a humidity of a gas in the case, the wireless communication circuitry further configured to compare the detected humidity with a threshold humidity and transmit a first warning signal to an external host via wireless communication when the detected humidity is greater than the threshold humidity.

2. The wafer carrier of claim 1, wherein the threshold humidity is about 15%.

3. The wafer carrier of claim 1, wherein the gas comprises a nitrogen gas.

4. The wafer carrier of claim 3, wherein the nitrogen gas has a humidity of about 5%.

5. The wafer carrier of claim 1, wherein the wireless communication circuitry is further configured to detect vibration of the case or the wafers.

6. The wafer carrier of claim 5, wherein the wireless communication circuitry is further configured to compare the detected vibration with a threshold vibration and transmit a second warning signal to the external host via the wireless communication when the detected vibration is greater than the threshold vibration.

7. The wafer carrier of claim 6, wherein the threshold vibration is about 0.8 G.

8. The wafer carrier of claim 1, wherein the wireless communication circuitry comprises:
   a communication part;
   a controller configured to control the communication part;
   a sensor connected to the controller and configured to detect the humidity of the gas; and
   a sensor interface connected between the controller and the sensor, the sensor interface including at least one of a differential amplifier circuit or a noise filter,
   wherein the controller is configured to compare the detected humidity from the sensor via the sensor interface with the threshold humidity and control the communication part to transmit the first warning signal to the external host when the detected humidity is greater than the threshold humidity.

9. The wafer carrier of claim 8, wherein the communication part comprises a Bluetooth Low Energy (BLE) apparatus.

10. The wafer carrier of claim 1, wherein the wafer carrier comprises:
    a door configured to open and close the case; and
    a slot wall including slots,
    wherein the wireless communication circuitry is between the slot wall and the inner sidewall of the case and at a location adjacent to the opening.

11. A wafer carrier comprising:
    a case;
    sensors in the case, the sensors configured to detect at least one of humidity, temperature, or vibration in the case and generate one or more sense signals; and
    a wireless communication circuitry in the case and connected to the sensors, the wireless communication circuitry configured to transmit a warning signal to an external host via wireless communication when a magnitude of at least one of the one or more sense signals is greater than a corresponding threshold value.

12. The wafer carrier of claim 11, wherein the sensors comprises a Film Bulk Acoustic Resonator (FBAR) sensor.

13. The wafer carrier of claim 12, wherein the FBAR sensor comprises a Complementary Metal Oxide Semiconductor (CMOS).

14. The wafer carrier of claim 11, wherein the sensors comprises a humidity sensor.

15. The wafer carrier of claim 14, wherein the sensors comprises a vibration sensor.

16. A wafer carrier comprising:
    a case defining a space therein and including an opening at least one side thereof;
    a slot wall on an inner sidewall of the case, the slot wall including slots configured to receive wafers;
    a door configured to open and close the case; and
    wireless communication circuitry between the slot wall and the inner sidewall of the case and at a location adjacent to the opening, the wireless communication circuitry configured to detect at least one of (1) a humidity of a gas in the case and (2) vibration of the case or the wafers, the wireless communication circuitry further configured to compare results of the detection with at least one threshold value and transmit at least one warning signal to an external host via wireless communication when the results of the detection is greater than the at least one threshold value.

17. The wafer carrier of claim 16, wherein
    the at least one warning signal includes a first warning signal and a second warning signal,
    the at least one threshold value includes a threshold humidity value and a threshold vibration value,
    the first warning signal is a warning signal when the detected humidity of the gas in the case is greater than the threshold humidity value, the second warning signal is a warning signal when the detected vibration of the case or the wafers is greater than the threshold vibration value.

18. The wafer carrier of claim 17, wherein the threshold humidity value is about 15%.

19. The wafer carrier of claim 17, wherein the threshold vibration value is about 0.8 G.

20. The wafer carrier of claim 17, wherein the wireless communication circuitry comprises:

a communication part;
a controller configured to control the communication part;
a sensor connected to the controller and configured to detect at least one of the humidity of the gas in the case and vibration of the case or the wafers; and
a sensor interface connected between the controller and the sensor, the sensor interface including at least one of a differential amplifier circuit or a noise filter,
wherein the controller is configured to compare a value of the detected humidity from the sensor via the sensor interface with the threshold humidity value and control the communication part to transmit the first warning signal to the external host when the value of the detected humidity is greater than the threshold humidity value.

* * * * *

UNITED STATES PATENT AND TRADEMARK OFFICE
CERTIFICATE OF CORRECTION

PATENT NO. : 10,424,497 B2  
APPLICATION NO. : 15/628725  
DATED : September 24, 2019  
INVENTOR(S) : Bum-Soo Kim et al.

Page 1 of 1

It is certified that error appears in the above-identified patent and that said Letters Patent is hereby corrected as shown below:

On the Title Page

Item (73) Assignee: should read as follows to add the 2nd assignee:  
(73) Assignee:  Samsung Electronics Co., Ltd.  
 Gyeonggi-do, KR  
 Pluto Solutions Inc.  
 Seoul, KR

Signed and Sealed this  
Seventh Day of July, 2020

Andrei Iancu  
*Director of the United States Patent and Trademark Office*